(12) United States Patent
Laflaquière

(10) Patent No.: US 11,899,136 B2
(45) Date of Patent: *Feb. 13, 2024

(54) INCREASING VCSEL PROJECTOR SPATIAL RESOLUTION

(71) Applicant: Apple Inc., Cupertino, CA (US)

(72) Inventor: Arnaud Laflaquière, Paris (FR)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/877,955

(22) Filed: Jul. 31, 2022

(65) Prior Publication Data
US 2022/0373656 A1 Nov. 24, 2022

Related U.S. Application Data

(63) Continuation of application No. 16/537,582, filed on Aug. 11, 2019, now Pat. No. 11,435,449.

(60) Provisional application No. 62/733,656, filed on Sep. 20, 2018.

(51) Int. Cl.
| | |
|---|---|
| G01S 7/481 | (2006.01) |
| G02B 26/00 | (2006.01) |
| G02B 26/08 | (2006.01) |
| G01S 17/08 | (2006.01) |
| G02B 26/10 | (2006.01) |
| H01S 5/42 | (2006.01) |
| H01S 5/042 | (2006.01) |

(52) U.S. Cl.
CPC ............ *G01S 7/4817* (2013.01); *G01S 17/08* (2013.01); *G02B 26/004* (2013.01); *G02B 26/0875* (2013.01); *G02B 26/10* (2013.01); *H01S 5/042* (2013.01); *H01S 5/423* (2013.01)

(58) Field of Classification Search
CPC ..... G01S 7/4817; G01S 17/08; G02B 26/004; G02B 26/0875; G02B 26/10; H01S 5/042; H01S 5/423
USPC ................................ 356/4.01; 359/665, 666
See application file for complete search history.

(56) References Cited

U.S. PATENT DOCUMENTS 11,435,449 B1 * 9/2022 Laflaquière ............ G02B 26/10

* cited by examiner

*Primary Examiner* — William Choi
(74) *Attorney, Agent, or Firm* — Kligler & Associates Patent Attorneys Ltd.

(57) ABSTRACT

An optical device includes a radiation source, which is configured to emit a beam of light, and a scanning cell positioned to receive the beam of light. The scanning cell includes transparent entrance and exit faces, at least one of the faces including a flexible membrane. A transparent fluid is contained between the entrance and exit faces, so that the beam enters the transparent fluid through the entrance face and exits the transparent fluid through the exit face. At least one actuator is coupled to the flexible membrane, and configured, responsively to an applied electrical signal, to apply an asymmetrical deformation to the flexible membrane, thereby deflecting the beam by refraction in the transparent fluid.

20 Claims, 6 Drawing Sheets

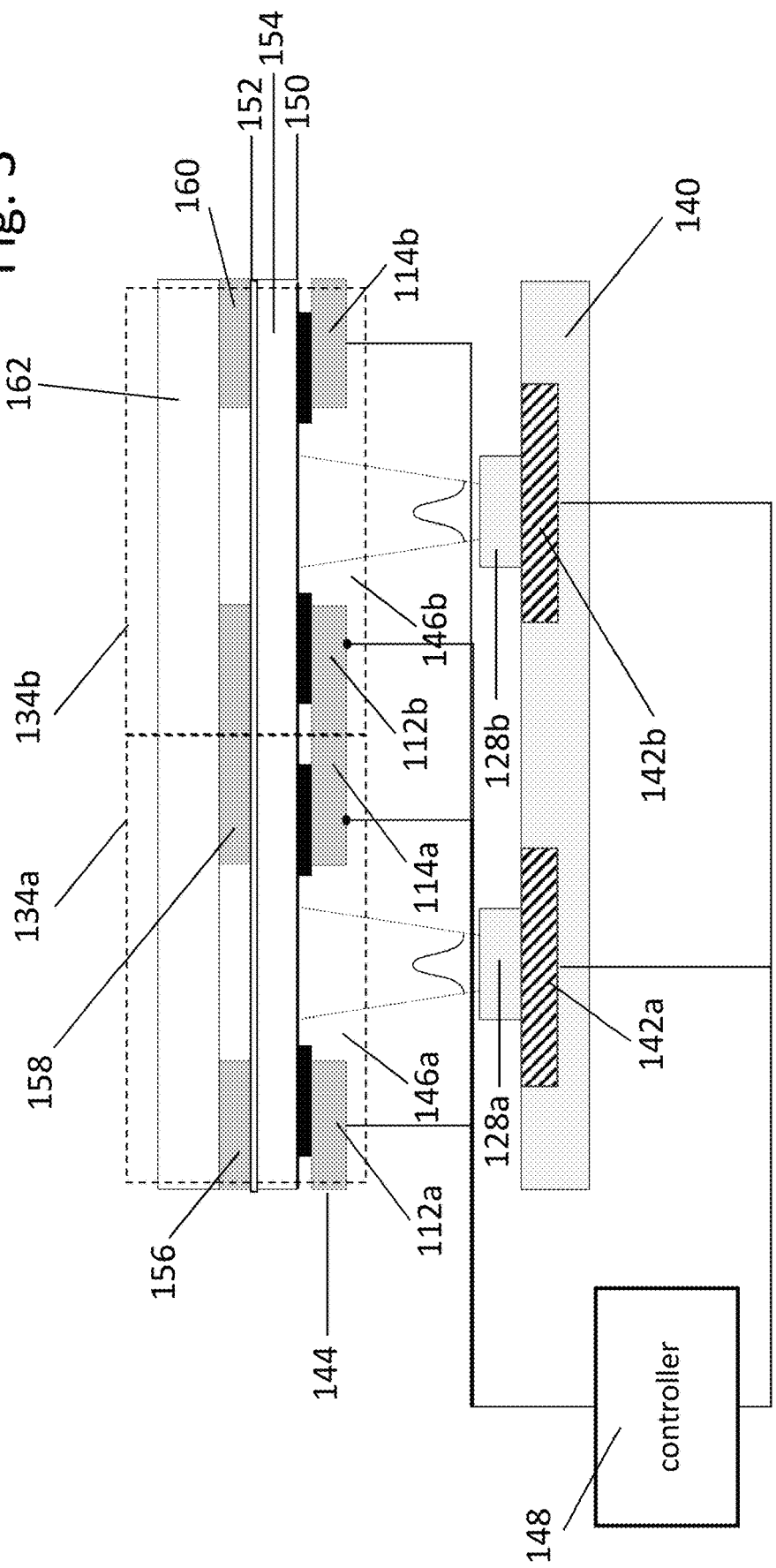

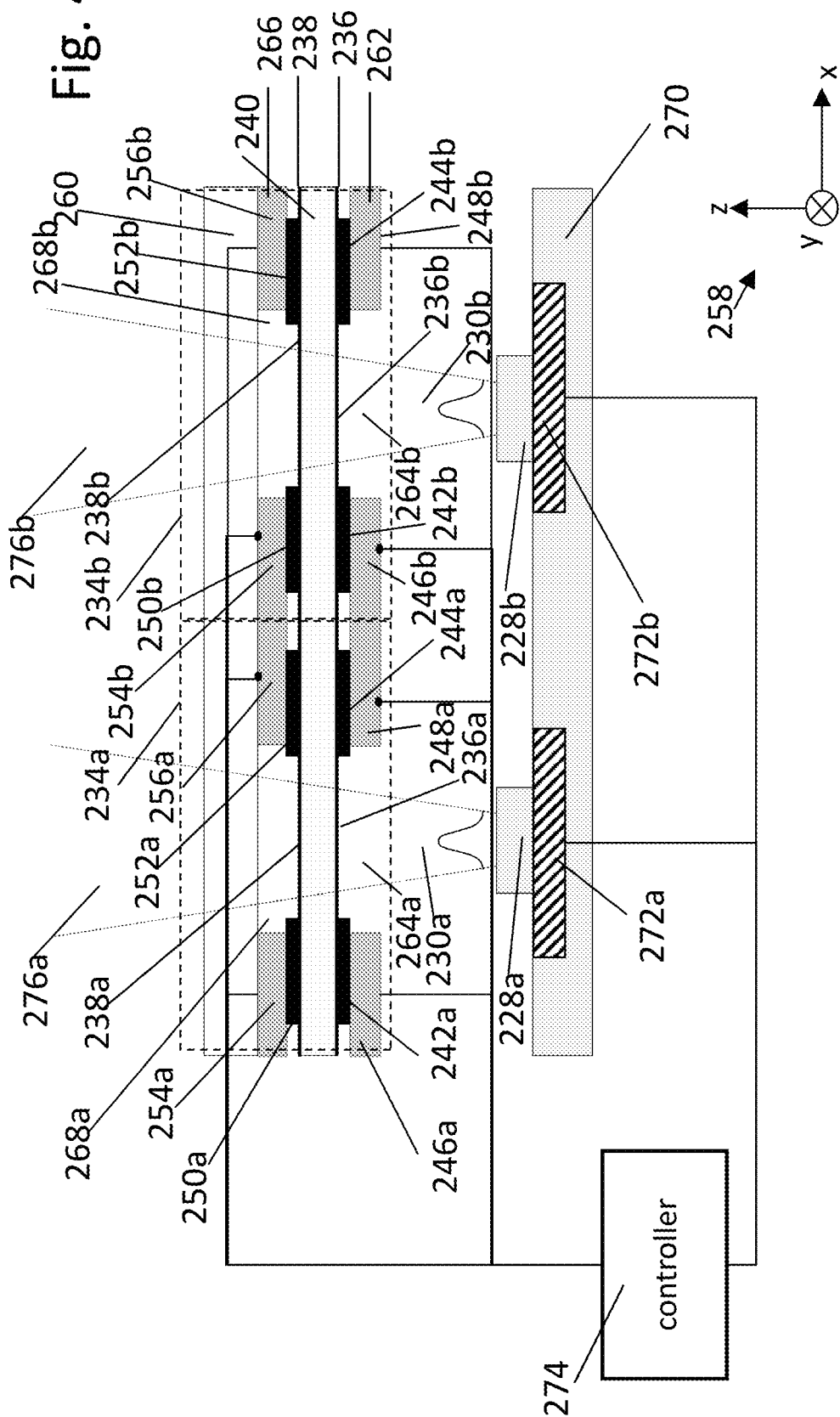

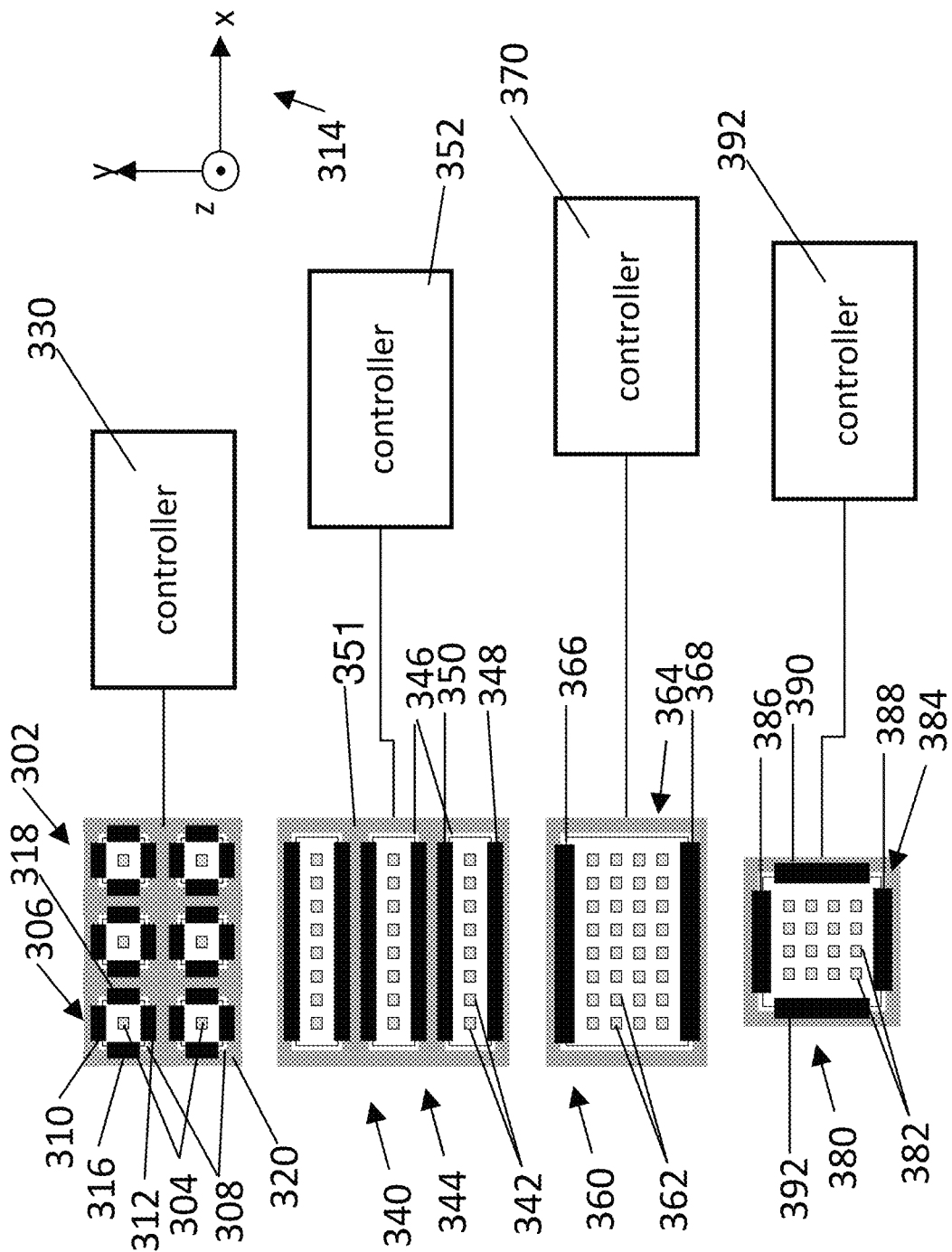

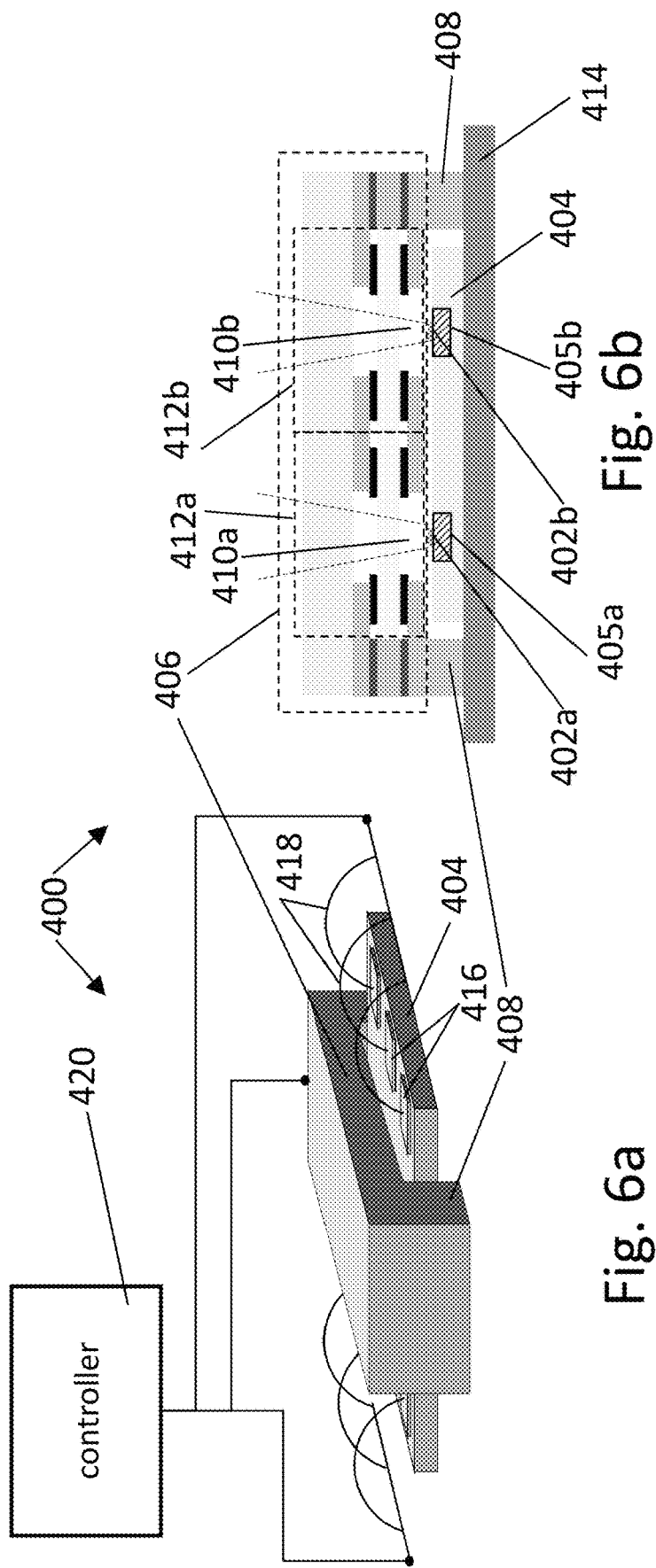

INCREASING VCSEL PROJECTOR SPATIAL RESOLUTION

CROSS-REFERENCE TO RELATED APPLICATION

This application is a continuation of U.S. patent application Ser. No. 16/537,582, filed Aug. 11, 2019, which claims the benefit of U.S. Provisional Patent Application 62/733,656, filed Sep. 20, 2018, which is incorporated herein by reference.

FIELD OF THE INVENTION

The present invention relates generally to opto-electronic devices, and particularly to light projectors.

BACKGROUND

Portable electronic devices, such as cellular phones, commonly employ one or more integral light sources. These light sources may provide illumination for a scene recorded by a camera integrated into the device.

As an example, United States Patent Application Publication 2018/0084241 describes a pattern projector, including a light source, configured to emit multiple beams of light. The beams are scanned in angular space by moving laterally a collimating lens of the projector.

As another example, United States Patent Application Publication 2018/0062345 describes another pattern projector, including a light source, configured to emit multiple beams of light. The beams are scanned in angular space by using several scanning mechanisms, including a lateral movement of a collimating lens, a lateral movement of the light source, rotating prisms, and a scanning mirror.

SUMMARY

Embodiments of the present invention that are described hereinbelow provide improved light projectors.

There is therefore provided, in accordance with an embodiment of the invention, an electro-optical device, including a radiation source, which is configured to emit multiple beams of light. A scanner includes an array of cells. Each cell is positioned to receive one or more of the beams of light and includes transparent entrance and exit faces, at least one of the faces including a flexible membrane, and a volume of a transparent fluid contained between the entrance and exit faces, so that the one or more of the beams enter the volume through the entrance face and exit the volume through the exit face. At least one actuator is coupled to the flexible membrane, and is configured, responsively to an applied electrical signal, to apply an asymmetrical deformation to the flexible membrane, thereby deflecting the one or more of the beams by refraction in the transparent fluid. A controller is configured to vary the electrical signal applied to each of the cells so as to scan the beams of light over respective angular ranges.

In some embodiments, the radiation source includes an addressable array of emitters, such as vertical-cavity surface-emitting lasers (VCSELs) In a disclosed embodiment, the addressable array includes a silicon substrate, on which the VCSELs are mounted and which includes circuitry configured to control each emitter independently.

In some embodiments, the device includes a lens, which is disposed to receive the beams exiting through the exit faces of the cells of the scanner and to transmit and project the beams towards a scene. The device may further include a receiver, which is configured to receive the light reflected from the scene and to output receiver signals in response to the received light, and processing circuitry, which is configured to process the receiver signals in order to map the scene in three dimensions.

In a disclosed embodiment, the at least one actuator is configured to apply the asymmetrical deformation to the flexible membrane, so as to deflect the one or more of the beams about a single deflection axis.

Additionally or alternatively, the transparent entrance face includes a first flexible membrane, and the transparent exit face includes a second flexible membrane, and the at least one actuator includes at least one first actuator coupled to the first flexible membrane and configured to apply a first asymmetrical deformation to the first flexible membrane so as to deflect the one or more of the beams about a first deflection axis, and at least one second actuator coupled to the second flexible membrane and configured to apply a second asymmetrical deformation to the second flexible membrane so as to deflect the one or more of the beams about a second deflection axis, which is not parallel to the first deflection axis.

In some embodiments, the at least one actuator includes at least one piezoelectric element. In a disclosed embodiment, the at least one piezoelectric element includes first and second piezoelectric elements positioned on two different sides of the flexible membrane, such that application of the electrical signal to the first piezoelectric element causes the cell to deflect the one or more of the beams in a first direction, while application of the electrical signal to the second piezoelectric element causes the cell to deflect the one or more of the beams in a second direction, different from the first direction.

In a disclosed embodiment, each cell is configured to receive and deflect a single one of the beams. Alternatively, each cell is configured to receive and deflect a group of the beams. Each cell may be configured to receive and deflect the one or more of the beams about a single deflection axis or about two deflection axes. In some embodiments, the controller is configured to apply different, respective electrical signals to different ones of the cells.

There is also provided, in accordance with an embodiment of the invention, a method of scanning, which includes directing multiple beams of light toward a scanner, including an array of cells. Each cell is positioned to receive one or more of the beams of light and includes transparent entrance and exit faces, at least one of the faces including a flexible membrane, and a volume of a transparent fluid contained between the entrance and exit faces, so that the one or more of the beams enter the volume through the entrance face and exit the volume through the exit face. At least one actuator is coupled to the at least one flexible membrane. An asymmetrical deformation is applied to the at least one flexible membrane by applying an electrical signal to the at least one actuator, thereby deflecting the one or more of the beams by refraction in the transparent fluid. The electrical signal applied to each of the cells is varied so as to scan the beams of light over respective angular ranges.

There is additionally provided, in accordance with an embodiment of the invention, a method of fabricating an electro-optical device, which includes providing a scanner, including an array of cells. Each cell includes transparent entrance and exit faces, at least one of the faces including a flexible membrane, a volume of a transparent fluid contained between the entrance and exit faces, and at least one actuator coupled to the flexible membrane, and configured, responsively to an applied electrical signal, to apply an asymmetrical deformation to the flexible membrane. The scanner is positioned in proximity to a radiation source, which is configured to emit multiple beams of light, so that each cell receives one or more of the beams of light such that the one or more of the beams enter the volume through the entrance face and exit the volume through the exit face. A controller is coupled to vary the electrical signal applied to each of the cells, thereby deflecting the one or more of the beams by refraction in the transparent fluid.

The present invention will be more fully understood from the following detailed description of the embodiments thereof, taken together with the drawings in which:

BRIEF DESCRIPTION OF THE DRAWINGS

FIG. 3 is a schematic sectional view of two scanner cells for two independent one-dimensional scans, illuminated by two mounted VCSELs, in accordance with an embodiment of the invention;

FIG. 4 is a schematic sectional view of two scanner cells for two independent two-dimensional scans, illuminated by two mounted VCSELs, in accordance with an embodiment of the invention;

FIGS. 5a-5d are schematic top views of VCSEL arrays and scanners, in accordance with embodiments of the invention; and FIGS. 6a-6b are schematic perspective and sectional views, respectively, of an electro-optical device, in accordance with an embodiment of the invention.

DETAILED DESCRIPTION OF EMBODIMENTS

Overview

Figure 1:
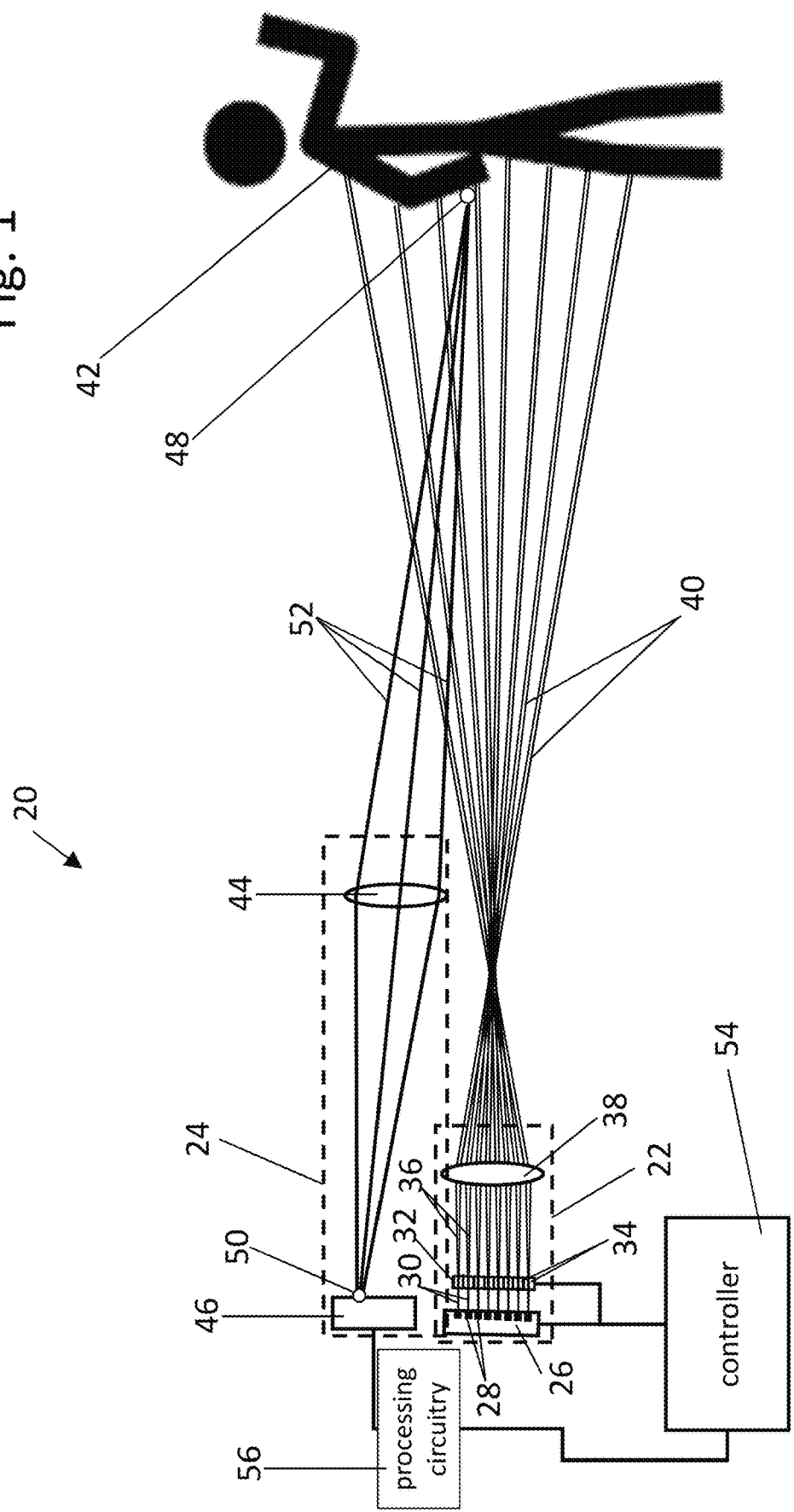
FIG. 1 is a schematic side view of an optical apparatus with beam scanning by a projector, in accordance with an embodiment of the invention.

Existing and emerging consumer applications have created an increasing need for beam projectors, which are used, for example, in real-time three-dimensional (3D) imagers, known also as 3D mappers. Some commonly-used 3D mappers utilize beam projectors comprising a laser array, projecting multiple optical beams onto the scene. The beam intercepts are imaged onto a detector array, and the distance to the intercept between each beam and the scene is measured either by measuring for each beam the time-of-flight from the laser array to the detector array via the scene, or by deriving the distance from the displacement of each intercept image on the detector array.

When the beams illuminating the scene are static (i.e., not scanned in a dimension transverse to the beams), a balance is struck between the total extent of the scene covered by the beams and the lateral spatial resolution on the scene (i.e., the resolution in a plane transverse to the beam axes): When a large area of the scene is covered, the lateral spatial resolution is limited to a linear extent of the illuminated scene divided by the number of beams along this linear extent. When the beams are projected closely together for a high lateral spatial resolution (small lateral separation between the beams), the extent of the illuminated target area is limited to a product of the spatial resolution and the number of beams across the linear dimension.

The embodiments of the present invention that are described herein address the above limitation so as to provide beam projectors illuminating a scene with high lateral spatial resolution. In the disclosed embodiments, a high lateral spatial resolution of the scene is achieved by scanning the beams emitted by a radiation source, such as an array of lasers or other emitters, in the angular space by transmitting the beams through fluid-filled cells that are deformable by an electrical signal, thus deflecting the beams responsively to the electrical signal. Depending on the configuration of the cells and addressability of the electrical signals, the beams may be scanned all together, or in separate groups, or separately and independently of one another. A small-angle angular scan is sufficient, as for a given array of illuminating beams the angular scan amplitude does not need to exceed the angular pitch of the array (although in some cases it may be advantageous to be capable of scanning over a slightly larger range, for example up to twice the angular pitch). This combination of an optical separation of the beams and a small-angle angular scan achieves a coverage of the entire extent of the scene, as well as a high spatial resolution, with the added advantage, in some embodiments, of an independent scan angle for each beam.

Another advantage can be achieved in some embodiments of the present invention by operating each emitter in the array individually. The combination of an individual control of both the presence of a beam and its direction enables a highly flexible generation of spot patterns on the scene, as well as a one-dimensional or two-dimensional (lateral) scan of the pattern, including changing the pattern during the scan.

In the disclosed embodiments, a radiation source emits multiple beams of light. (The terms "optical radiation" and "light" as used in the present description and in the claims refer generally to any and all of visible, infrared, and ultraviolet radiation.) The angular scan of one or more beams of light is accomplished by an array of fluid-optical cells. Each cell comprises transparent entrance and exit faces, wherein at least one of the faces is a flexible membrane. A volume of transparent fluid, such as a liquid or a gel, is contained between the entrance and exit faces, so that one or several beams of light enter the volume through the entrance face and exit through the exit face. One or more actuators are coupled to each flexible membrane. Applying electrical signals to the actuators of a given membrane causes the actuators to apply an asymmetrical deformation to the membrane, thereby deflecting the beams of light by refraction in the transparent fluid. A controller is configured to vary the electrical signals applied to the cells so as to scan the beams of light over respective angular ranges.

In some embodiments, the radiation source comprises an addressable array of emitters, for example vertical-cavity surface-emitting lasers (VCSELs). For addressability, the VCSELs can be grown on a III-V substrate, which is bonded to a silicon substrate with addressable drive circuits. These addressable drive circuits enable independent control of each of the VCSELs in the array.

A lens is positioned to receive the beams exiting through the exit faces of the cells of the scanner and to transmit and project the beams towards a scene. For mapping the scene in three dimensions (3D), a receiver is positioned to receive the light reflected from the scene and to output receiver signals in response to the received light. Processing circuitry processes the signals output by the receiver in order to produce a 3D map of the scene.

The cells of the scanner can be configured to deflect the beams about either one or two deflection axes. A cell having one flexible membrane and either one actuator or two actuators, which are coupled to and positioned on opposing sides of the membrane, will deflect a transmitted beam (or beams) about a single deflection axis. A cell in which both the entrance and exit faces comprise flexible membranes, with either one actuator or two actuators coupled to each membrane, and with the actuators of the two membranes oriented with respect to each other at angles other than 0° or 180°, will deflect a transmitted beam (or beams) about two non-parallel deflection axes. Typically, the actuators are configured so that the deflection axes are mutually perpendicular.

In some embodiments, the actuators used to deform the flexible membranes are piezoelectric elements, which bend under an applied electrical signal. Alternatively, other suitable types of actuators may be used, such as actuators based on micro-electro-mechanical systems (MEMS) technology. When two piezoelectric elements are positioned on two different sides of the flexible membrane, applying an electrical signal to one piezoelectric element causes the cell to deflect the beam (or beams) to one direction, while applying an electrical signal to the other piezoelectric element causes the cell to deflect the beam (or beams) to another direction. By positioning the actuators symmetrically around the membrane, the beam (or beams) is deflected about a single deflection axis to both sides of the un-deflected beam.

By a suitable configuration of the cells and the actuators with respect to the emitted beams, different scan modes may be implemented:
1. each cell is configured to receive and deflect a single beam (point scan);
2. each cell is configured to receive and deflect a group of beams;
3. each cell is configured to receive and deflect a single beam or a group of beams about a single deflection axis (one-dimensional scan); and
4. each cell is configured to receive and deflect a single beam or a group of beams about two deflection axes (two-dimensional scan).

The controller driving the scanner can be configured to apply independent electrical signals to each of the cells, or to drive groups of the cells or all of the cells together.

System Description

FIG. 1 is a schematic side view of an optical apparatus 20 with beam scanning by a projector 22, in accordance with an embodiment of the invention. FIG. 1 illustrates an overall architecture of optical apparatus 20 that can be used for 3D mapping. Alternatively, projector 22 may be used in other applications that use a scanned array of beams of optical radiation.

Optical apparatus 20 comprises projector 22 and a receiver 24. Projector 22 comprises a two-dimensional array 26 of emitters, comprising individual VCSELs 28 in this embodiment, in either a regular or irregular (for example, pseudo-random) spatial array. The VCSELs emit an array of beams 30 of light, which may be pulsed or continuous. Beams 30 impinge on a scanner 32 comprising a two-dimensional array of cells 34, each cell positioned to receive one beam. Scanner 32 deflects beams 30 in two lateral dimensions, thus outputting corresponding beams 36, which impinge on a lens 38, which refracts, collimates, and projects them into beams 40.

Beams 30 are emitted at VCSELs 28 with a typical cross-section of 10 µm and with a typical half-angle of 12°, expanding typically to several millimeters at lens 38, and continuing from there as collimated beams 40 with a roughly constant cross-section. The local angular pitch of beams 40 is determined by the local spatial pitch of VCSEL array 26, which is typically less than 50 µm, and the focal length of optics 38. The directional angle of each of beams 40 is deflected by the corresponding cell 34 of scanner 32 so as to scan an angular range that is equal to or somewhat greater than the local angular pitch. This scan range will suffice to scan the entire field of view (FOV) of projector (as defined by the outermost of rays 40). A typical range of deflection is ±1°, and thus VCSEL array 26 comprising 30 elements in each linear direction is sufficient to scan a FOV of 60°.

Beams 40 impinge on a scene 42, from which they are reflected towards receiver 24. Receiver 24 comprises collection optics 44 and a detector array 46. Detector array 46 receives an image of the pattern projected onto scene 42, exemplified by light reflected from a point 48 on the scene and received at a point 50 on the detector array (shown schematically by rays 52).

A controller 54 drives VCSEL array 26 and scanner 32, as well as receives signals from detector array 46 via processing circuitry 56 for calculating a depth map of scene 42. As described above, the distance to scene 42 may be measured either by measuring the round-trip time of the optical beams from VCSEL array 26 to detector array 46, or by capturing an image of the projected pattern on the detector array and deriving the distance from the local displacement of the pattern.

By driving individual cells 34 of scanner 32, controller 54 scans beams 40 on scene 42 at a resolution that is much higher than the inherent beam separation for a discrete VCSEL array 26 with static beams (i.e., without scanning). Moreover, controller 54 may fire VCSELs 28 individually or in groups, thus controlling the pattern of beams 40 projected onto and scanned over scene 42.

Although controller 54 and processing circuitry 56 are shown in FIG. 1, for the sake of convenience, as single functional blocks, in practice the functions of the "controller" and "processing circuitry" may be implemented in a single physical unit, such as a suitable integrated circuit, or in two or more separate physical units for each. These functions may be implemented in software or in hardware logic or in a combination of software and hardware functions. In either case, controller 54 and processing unit 56 have suitable interfaces for receiving and transmitting data and instructions to and from other elements of apparatus 20 as described.

Figures 2A, 2B, 2C:
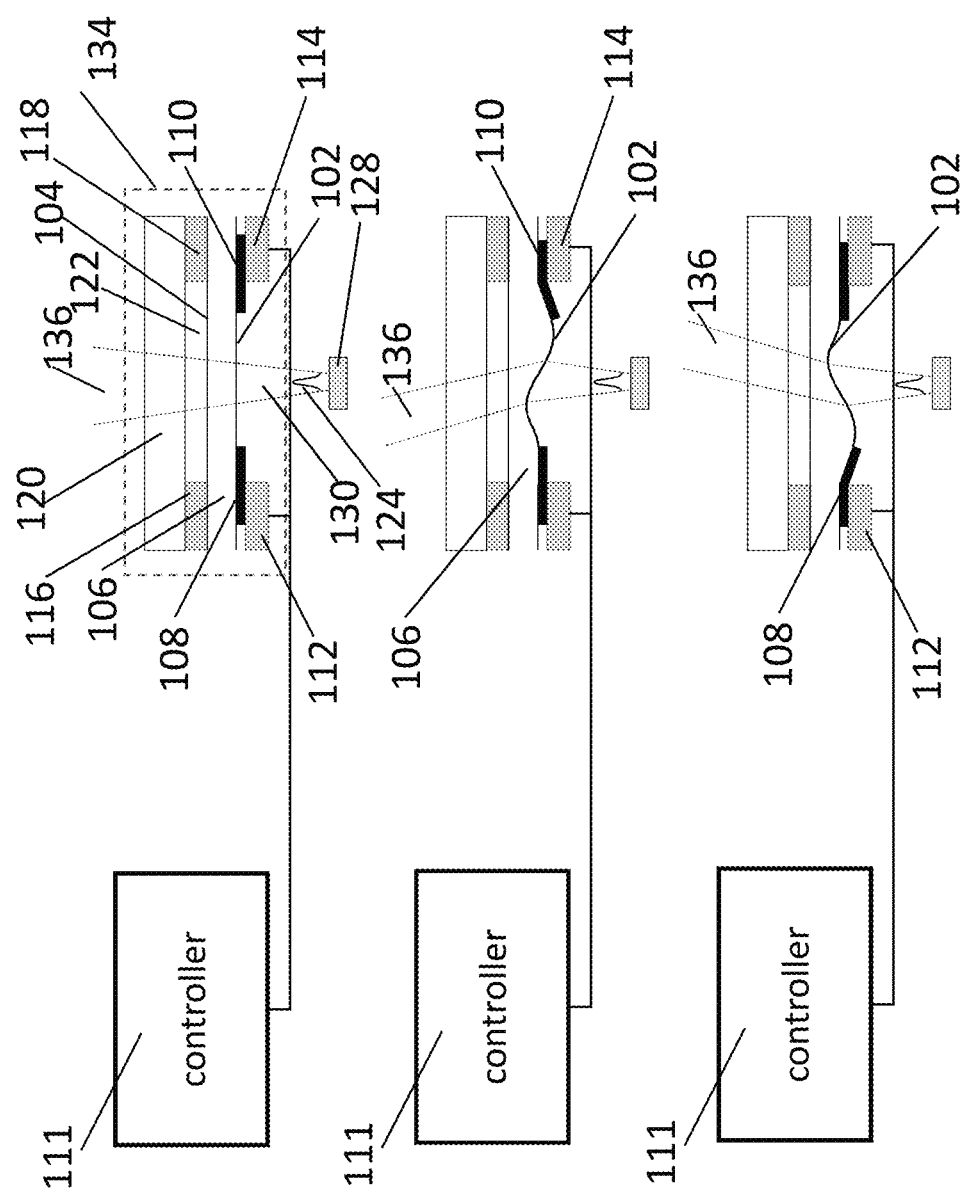
FIGS. 2a-2c are schematic sectional views of a scanner cell for a one-dimensional scan, illuminated by a VCSEL, in different states of operation, in accordance with an embodiment of the invention.

FIGS. 2a-2c are schematic sectional views of a scanner cell 134 for a one-dimensional scan, illuminated by a VCSEL 128, in different states of operation, in accordance with an embodiment of the invention.

Cell 134 comprises transparent entrance and exit faces 102 and 104, respectively, wherein the entrance face comprises a flexible membrane and the exit face comprises a transparent window, for example glass. A volume of a transparent fluid 106 is contained between entrance face 102 and exit face 104. Two actuators 108 and 110, respectively, are attached to opposite sides of entrance face 102. Two electrodes 112 and 114 are coupled respectively to actuators 108 and 110. A controller 111 (similar to controller 54 in FIG. 1) is coupled to electrodes 112 and 114. Cell 134 further comprises two spacers 116 and 118 and a transparent window 120 (made out of, for example, glass), providing support and protection to the cell. A space 122 between exit face 104 and window 120 contains air or a transparent material. Transparent fluid 106 comprises either a liquid or a deformable polymer, which typically has a refractive index exceeding 1.3 and a thickness of tens or hundreds of microns. Actuators 108 and 110, as well as the actuators in subsequent figures, are assumed to be piezoelectric elements, which bend under an applied electrical signal.

FIG. 2a shows cell 134 when no electrical signals are applied by controller 111 to electrodes 112 and 114, and consequently no deformation is applied to the flexible membrane of entrance face 102 by actuators 108 and 110. A beam 130 that is emitted by VCSEL 128, with a Gaussian distribution of optical power within the beam shown schematically by a curve 124, is transmitted by cell 134 to a beam 136 without any deflection. For the sake of clarity, optical refractions at planar interfaces are not shown in FIGS. 2a-2c.

FIG. 2b shows cell 134 when an electrical signal is applied by controller 111 to electrode 114. (As the elements in FIGS. 2b-2c are identical to those in FIG. 2a, only those specifically referred to in the text of FIGS. 2b-2c are labelled.) Actuator 110 is bent due to the electrical signal, and the bending causes an asymmetric deformation of entrance face 102. Due to this asymmetric deformation and the consequent asymmetric shape of the volume of transparent fluid 106 contained in cell 134, beam 136 is deflected to the left. The amount of deflection is determined by the electrical signal applied by controller 111.

FIG. 2c shows cell 134 when an electrical signal is applied by controller 111 to electrode 112. Actuator 108 is bent due to the electrical signal, and the bending causes an asymmetric deformation, opposite to that in FIG. 2b, of entrance face 102. Due to this asymmetric deformation and the consequent asymmetric shape of the volume of a transparent fluid 106, beam 136 is deflected to the right.

FIG. 3 is a schematic sectional view of two scanner cells 134a and 134b for two independent one-dimensional scans, illuminated by two mounted VCSELs 128a and 128b, in accordance with an embodiment of the invention.

FIG. 3 shows the assembly of two of cells 134 of the type shown in FIGS. 2a-2c, to create a two-cell scanner. Large-scale scanners, with tens or hundreds of beams, may be produced simply by extending the principles of this embodiment. The same labels are used as in FIGS. 2a-c, with the addition of "a" and "b" for cells 134a and 134b, respectively. VCSELs 128a and 128b are mounted on a silicon substrate 140 containing respective circuits 142a and 142b, which are configured to control each VCSEL independently. Scanner cells 134a and 134b have been fabricated on a silicon substrate 144, which was then thinned, with openings 146a and 146b formed to permit beams from VCSELs 28a and 28b to pass through the substrate. Electrodes 112a and 114a for cell 134a and electrodes 112b and 114b for cell 134b have been formed on silicon substrate 144. An entrance face 150, comprising a flexible membrane, and an exit face 152, comprising a transparent window, are shared by cells 134a and 134b, but each cell has its own actuators 108, 110 connected to its respective electrodes. A volume of a transparent fluid 154, similar to transparent fluid 106 in FIG. 2, is contained between entrance and exit faces 150 and 152. Spacers 156, 158, and 160 are similar to spacers 116 and 118 in FIG. 1. A window 162 is similar to window 120 in FIG. 2, and is shared by cells 134a and 134b.

A controller 148 (similar to controller 54 in FIG. 1) is coupled to circuits 142a and 142b, as well as to electrodes 112a, 112b, 114a, and 114b, and thus controls both the firing of VCSELs 128a and 128b and beam deflection by cells 134a and 134b.

Although FIG. 3 shows only two scanner cells, larger numbers of scanner cells may be fabricated either as a line array or as a two-dimensional array. Such arrays may have regular or irregular spacing between the cells.

FIG. 4 is a schematic sectional view of two scanner cells 234a and 234b for two independent two-dimensional scans, illuminated by two mounted VCSELs 228a and 228b, in accordance with an embodiment of the invention.

Similarly to FIG. 3, VCSELs 228a and 228b are mounted on a silicon substrate 270 containing respective circuits 272a and 272b, which are configured to control each VCSEL independently. Two flexible membranes 236 and 238 form the entrance and exit faces, respectively, for cells 234a and 234b. Specifically, cells 234a and 234b have entrance faces 236a and 236b and exit faces are 238a and 238b, respectively. A volume of a transparent fluid 240, similar to transparent fluid 106 in FIG. 2, is contained between flexible membranes 236 and 238. In order to present the exit face actuators and electrodes in the sectional view of FIG. 4, the actuators and electrodes coupled to exit faces 238a and 238b have been, for the figure, rotated by 90° around a z-axis of a Cartesian coordinate system 258.

For the entrance faces, two actuators 242a and 244a, respectively, are attached to opposite sides of entrance face 236a. Similarly, two actuators 242b and 244b, respectively, are attached to opposite sides of entrance face 236b. Two electrodes 246a and 248a are coupled respectively to actuators 242a and 244a. Similarly, two electrodes 246b and 248b are coupled respectively to actuators 242b and 244b.

For the exit faces, two actuators 250a and 252a, respectively, are attached to opposite sides of exit face 238a. Similarly, two actuators 250b and 252b, respectively, are attached to opposite sides of entrance face 236b. Two electrodes 254a and 256a are coupled respectively to actuators 250a and 252a. Similarly, two electrodes 254b and 256b are coupled respectively to actuators 250b and 252b. For cell 234a, actuators 250a and 252a coupled to exit face 238a, together with respective electrodes 254a and 256a, are orthogonal to actuators 242a and 244a coupled to entrance face 236a and their respective electrodes 246a and 248a. Similarly for cell 234b, the exit face actuators and their electrodes are orthogonal to the entrance face actuators and their electrodes.

A transparent window 260 protects cells 234a and 234b and is shared by them. Controller 274 (similar to controller 54 in FIG. 1) is coupled to circuits 272a and 272b, as well as to electrodes 246a, 246b, 248a, 248b, 254a, 254b, 256a, and 256b.

When no electrical signals are applied to any of the electrodes of cells 234a and 234b, beams 230a and 230b, emitted by VCSELs 228a and 228b, respectively, are transmitted through the cells and emitted without deflection as beams 276a and 276b, respectively.

By applying an electrical signal to electrode 246a, actuator 242a is bent, and entrance face 236a is deformed asymmetrically. The subsequent deformation of volume of transparent fluid 240 adjacent to entrance face 236a causes beam 276a to deflect about the y-axis of Cartesian coordinate system 258. By applying an electrical signal to the opposing electrode 244a, beam 276a is, through a similar mechanism, deflected to an opposite direction about the y-axis. Similar deflection about the y-axis may be accomplished for beam 276b by applying electrical signals to electrodes 242b and 244b.

A deflection of beam 276a about the x-axis of Cartesian coordinate system 258, i.e., orthogonally with respect to the previously described direction, is accomplished by applying electrical signals to electrodes 250a and 252a. Similarly, a deflection of beam 276b about x-axis is accomplished by applying electrical signals to electrodes 250b and 252b.

By a simultaneous application of electrical signals to the mutually orthogonal electrodes of cell 234a, beam 276a may be deflected simultaneously about both x- and y-axes, with the same applying to cell 234b.

Electrodes 246a, 246b, 248a, and 248b, together with actuators 242a, 242b, 244a, 244b and membrane 236 have been fabricated on a silicon substrate 262, which was then thinned, with openings 264a and 264b formed to permit the passage of beams from VCSELs 228a and 228b. Similarly but separately, electrodes 254a, 254b, 256a, and 256b, together with actuators 250a, 250b, 252a, 252b and membrane 238 have been fabricated on a silicon substrate 266, similarly thinned, with openings 268a and 268b formed to permit the passage of beams from VCSELs 228a and 228b. After the above-described fabrication, thinned wafers 262 and 266 are brought into close proximity, with membranes 236 and 238 facing each other and with the openings in the two wafers aligned. The cavity between the membranes is then filled with transparent fluid 240.

Although FIG. 4 shows only two scanner cells, larger numbers of scanner cells may be fabricated either as a line array or as a two-dimensional array, as noted above.

FIGS. 5a-5d are schematic top views showing configurations of VCSEL arrays and scanners, in accordance with embodiments of the invention.

FIG. 5a shows a scanner 306 overlaid on a 2×3 array 302 of VCSELs 304. Scanner 306 comprises a 2×3 array of cells 308, such that each cell is aligned with a VCSEL 304. Each cell 308 is a two-dimensional scanner cell, similar to cells 234a and 234b in FIG. 4, and comprises two actuators 310 and 312, aligned along the x-axis of a Cartesian coordinate system 314, and two actuators 316 and 318, aligned along the y-axis of the Cartesian coordinate system. For the sake of clarity, all the actuators are fully visible in all of FIGS. 5a-5d in the top view, although in the actual cells parts of the actuators would be covered in this view, but none of the other details in cells 308 are shown. A thinned silicon wafer 320 makes up one of the thinned wafers of scanner 306, similar to one of thinned wafers 262 and 266 in FIG. 4.

Controller 330 (similar to controller 54 in FIG. 1) is coupled to the electrodes of cells 308, as well as to VCSELs 304 (through the respective driving circuits of the VCSELs). By applying electrical signals to actuators 310 and 312, the beam emitted by each VCSEL 304 may be deflected about the x-axis, and by applying electrical signals to actuators 316 and 318, the beam emitted by each VCSEL 304 may be deflected about the y-axis. By applying independent electrical signals simultaneously to both pairs of actuators, arbitrary deflection angles (within the maximal deflection achievable by cells 308) may be achieved. By driving, for example, all actuators 310 (or actuators 312) with the same signal, a synchronized scanning about x-axis is achieved. This sort of drive may be accomplished either by output of this same signal from controller 330 to each of cells 308 individually or by wiring all the electrodes of actuators 310 (and/or the electrodes of actuators 312) together for simplified wiring. Similar synchronized scanning may be achieved about the y-axis by driving all actuators 316 (or actuators 318) with the same signal. As each VCSEL 304 of VCSEL array 302 may be driven independently by controller 330, single-beam scans (point scans), as well as other beam patterns, may be achieved.

FIG. 5b shows a scanner 344 overlaid on a VCSEL array 340 comprising three lines of VCSELs 342, with eight VCSELs in each line. Scanner 344 comprises three cells 346, such that each cell is aligned with a line of VCSELs 304 and encompasses all eight VCSELs in that line. Each cell 346 is a one-dimensional scanner cell similar to cells 134a and 134b in FIG. 3, and comprises two actuators 348 and 350, aligned along the x-axis of Cartesian coordinate system 314. A thinned silicon wafer 351 is similar to thinned wafer 144 of FIG. 3.

Controller 352 (similar to controller 54 in FIG. 1) is coupled to the electrodes of actuators 348 and 350 of each cell 346, as well as to VCSELs 342. By applying electrical signals to actuators 348 and 350 of a given cell, the beams emitted by VCSELs 342 that are aligned with that cell may be deflected about the x-axis, thus performing a line scan. Cells 346 may be driven either independently or in unison by controller 352. Alternatively, by wiring all electrodes for actuators 348 together and all electrodes of actuators 350 together, synchronized line scans are achieved with simplified wiring. One-dimensional point-scanning is achieved by driving one VCSEL 342 at a time.

FIG. 5c shows a 4×8 VCSEL array 360 comprising VCSELs 362, overlaid by a single-cell scanner 364, encompassing all of VCSELs 362. Scanner 364 is a one-dimensional scanner similar to one of cells 134a and 134b in FIG. 3, and comprises two actuators 366 and 368, aligned along the x-axis of Cartesian coordinate system 314. A thinned silicon wafer 370 is similar to thinned wafer 144 of FIG. 3.

Controller 370 (similar to controller 54 in FIG. 1) is coupled to the electrodes of actuators 366 and 368, as well as to VCSELs 362. By applying electrical signals to actuators 366 and 368, the beams emitted by VCSELs 362 may be deflected about the x-axis, thus performing a one-dimensional array scan. One-dimensional point-scanning is achieved by driving one VCSEL 362 at a time.

FIG. 5d shows a 4×4 VCSEL array 380 comprising VCSELs 382, overlaid by a single-cell scanner 384, encompassing all VCSELs 382. Scanner 384 is a two-dimensional scanner similar to one of cells 234a and 234b in FIG. 4, and comprises two orthogonal pairs of actuators, with actuators 386 and 388 aligned along the x-axis, and actuators 390 and 392 aligned along the y-axis. A thinned silicon wafer 394 makes up one of the thinned wafers of scanner 384, similarly to one of thinned wafers 262 and 266 in FIG. 4.

Controller 392 (similar to controller 54 in FIG. 1) is coupled to the electrodes of scanner 384, as well as to VCSELs 382. By applying electrical signals to actuators 386 and 388, the beams emitted by VCSELs 382 may be deflected about the x-axis, and by applying electrical signals to actuators 390 and 392, the beams emitted by the VCSELs may be deflected about the y-axis. Applying simultaneous but independent electrical signals to both pairs of actuators, an arbitrary deflection angle (within the maximal deflection of scanner 384) may be achieved. By selectively driving VCSELs 382 by controller 392, any combination of beams from VCSEL array 380 may be emitted, as well as scanned in one or two dimensions.

FIGS. 6a-6b are schematic perspective and sectional views, respectively, of an electro-optical device 400, in accordance with an embodiment of the invention.

Electro-optical device 400 comprises two VCSELs 402a and 402b, mounted on a silicon substrate 404 containing respective circuits 405a and 405b, which are configured to control each VCSEL independently, and a scanner 406 supported by spacers 408. Scanner 406 comprises two cells 412a and 412b for two independent two-dimensional scans, similar to cells 234a and 234b in FIG. 4. Due to this similarity, the elements of cells 412a and 412b have not been labelled. The height of spacers 408 is determined so that the lower surfaces of cells 412a and 412b are within a small distance, for example 10 μm, of the top surfaces of VCSELs 402a and 402b, respectively. This minimization of the gap between cell 412a and VCSEL 402a and between cell 412b and VCSEL 402b ensures that diverging beams 410a and 410b, which are emitted by VCSELs 402a and 402b, respectively, pass through cells 412a and 412b without the beams being clipped.

Both silicon substrate 404 and scanner 406, together with spacers 408, are mounted on a ceramic substrate 414 (not shown in FIG. 6a). A controller 420 (similar to controller 54 in FIG. 1) is coupled to scanner 406, as well as to circuits 405a and 405b, via bonding pads 416 and wire bonds 418.

Although FIG. 6b shows only two scanner cells, larger numbers of scanner cells may be fabricated either as a line array or as a two-dimensional array.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
   a radiation source, which is configured to emit a beam of light; and
   a scanning cell positioned to receive the beam of light and comprising:
      transparent entrance and exit faces, at least one of the faces comprising a flexible membrane;
      a transparent fluid contained between the entrance and exit faces, so that the beam enters the transparent fluid through the entrance face and exits the transparent fluid through the exit face; and
      at least one actuator coupled to the flexible membrane, and configured, responsively to an applied electrical signal, to apply an asymmetrical deformation to the flexible membrane, thereby deflecting the beam by refraction in the transparent fluid.

2. The device according to claim 1, and comprising a controller, which is configured to vary the electrical signal applied to the at least one actuator so as to adjust a deflection angle of the beam.

3. The device according to claim 2, wherein the controller is configured to vary the electrical signal so as to scan the beam of light over an angular range.

4. The device according to claim 3, and comprising a lens, which is disposed to receive the beam exiting through the exit face of the scanning cell and to transmit and project the beam towards a scene.

5. The device according to claim 4, and comprising a receiver, which is configured to receive the light reflected from the scene and to output receiver signals in response to the received light, and processing circuitry, which is configured to process the receiver signals in order to map the scene in three dimensions.

6. The device according to claim 1, wherein the radiation source is configured to emit multiple beams of light into the scanning cell, and wherein the scanning cell is configured to deflect the multiple beams.

7. The device according to claim 1, wherein the at least one actuator is configured to apply the asymmetrical deformation to the flexible membrane in a single direction, so as to deflect the beam about a single deflection axis.

8. The device according to claim 1, wherein the transparent entrance face comprises a first flexible membrane, and the transparent exit face comprises a second flexible membrane, and wherein the at least one actuator is configured to apply a first asymmetrical deformation to the first flexible membrane in a first direction so as to deflect the beam about a first deflection axis and to apply a second asymmetrical deformation to the second flexible membrane in a second direction so as to deflect the beam about a second deflection axis, which is not parallel to the first deflection axis.

9. The device according to claim 8, wherein the at least one actuator comprises a first actuator coupled to deform the first flexible membrane and a second actuator coupled to deform the second flexible membrane.

10. The device according to claim 9, wherein the first and second actuators comprise piezoelectric elements.

11. The device according to claim 8, wherein the first and second directions are mutually orthogonal.

12. The device according to claim 1, wherein the at least one actuator comprises at least one piezoelectric element.

13. The device according to claim 12, wherein the at least one piezoelectric element comprises first and second piezoelectric elements coupled respectively to first and second sides of the flexible membrane.

14. The device according to claim 13, wherein actuating the first piezoelectric element causes the cell to deflect the beam in a first direction, and actuating the second piezoelectric element causes the cell to deflect the beam in a second direction, different from the first direction.

15. A method of scanning, comprising:
   directing a beam of light into a scanning cell having transparent entrance and exit faces and containing a transparent fluid between the entrance and exit faces, at least one of the faces comprising a flexible membrane, such that the beam enters the transparent fluid through the entrance face and exits the transparent fluid through the exit face; and
   applying an electrical signal to at least one actuator coupled to the flexible membrane so as to create an asymmetrical deformation to the flexible membrane, thereby deflecting the beam by refraction in the transparent fluid.

16. The method according to claim 15, wherein applying the electrical signal comprises varying the electrical signal applied to the at least one actuator so as to scan the beam of light over an angular range.

17. The method according to claim 15, wherein applying the electrical signal comprises deforming the flexible membrane so as to deflect the beam about a single deflection axis.

18. The method according to claim 15, wherein the transparent entrance and exit faces respectively comprise first and second flexible membranes, and wherein applying the electrical signal comprises applying a first asymmetrical deformation to the first flexible membrane in a first direction so as to deflect the beam about a first deflection axis and applying a second asymmetrical deformation to the second flexible membrane in a second direction so as to deflect the beam about a second deflection axis, which is not parallel to the first deflection axis.

19. The method according to claim 18, wherein the first and second directions are mutually orthogonal.

20. The method according to claim 15, wherein the at least one actuator comprises at least one piezoelectric element.

\* \* \* \* \*